(12) United States Patent
Kim et al.

(10) Patent No.: US 7,888,237 B2
(45) Date of Patent: Feb. 15, 2011

(54) METHOD OF CUTTING SEMICONDUCTOR WAFER, SEMICONDUCTOR CHIP APPARATUS, AND CHAMBER TO CUT WAFER

(75) Inventors: Dong-Han Kim, Osan-si (KR);
Kyoung-Sei Choi, Yongin-si (KR);
Chul-woo Kim, Cheonan-si (KR)

(73) Assignee: Samsung Electronics Co., Ltd, Suwon-si (KR)

( * ) Notice: Subject to any disclaimer, the term of this patent is extended or adjusted under 35 U.S.C. 154(b) by 352 days.

(21) Appl. No.: 12/265,165

(22) Filed: Nov. 5, 2008

(65) Prior Publication Data
US 2009/0117710 A1      May 7, 2009

(30) Foreign Application Priority Data
Nov. 5, 2007   (KR) .............. 10-2007-0112165

(51) Int. Cl.
*H01L 21/00* (2006.01)
(52) U.S. Cl. .............. 438/462; 438/460; 438/461; 438/463; 438/464; 438/465

(58) Field of Classification Search .......... 438/460–465
See application file for complete search history.

(56) References Cited

U.S. PATENT DOCUMENTS

2008/0121906 A1*  5/2008  Yakushiji ............... 257/94
2009/0081828 A1*  3/2009  Freidhoff et al. ........ 438/113

FOREIGN PATENT DOCUMENTS

| JP | 05-226467 | 9/1993 |
| JP | 07-240392 | 9/1995 |
| KR | 1999-75107 | 10/1999 |
| KR | 2004-6420 | 1/2004 |

* cited by examiner

*Primary Examiner*—N Drew Richards
*Assistant Examiner*—Jae Lee
(74) *Attorney, Agent, or Firm*—Stanzione & Kim LLP

(57) ABSTRACT

A method of cutting a semiconductor wafer includes preparing a semiconductor wafer including a scribe region and a chip region, forming a groove in the scribe region, loading the semiconductor wafer with the groove formed therein in a chamber, and cutting the semiconductor wafer into a plurality of chips through increasing a pressure of the chamber by a first pressure change rate, and then reducing the pressure of the chamber by a second pressure change rate.

15 Claims, 16 Drawing Sheets

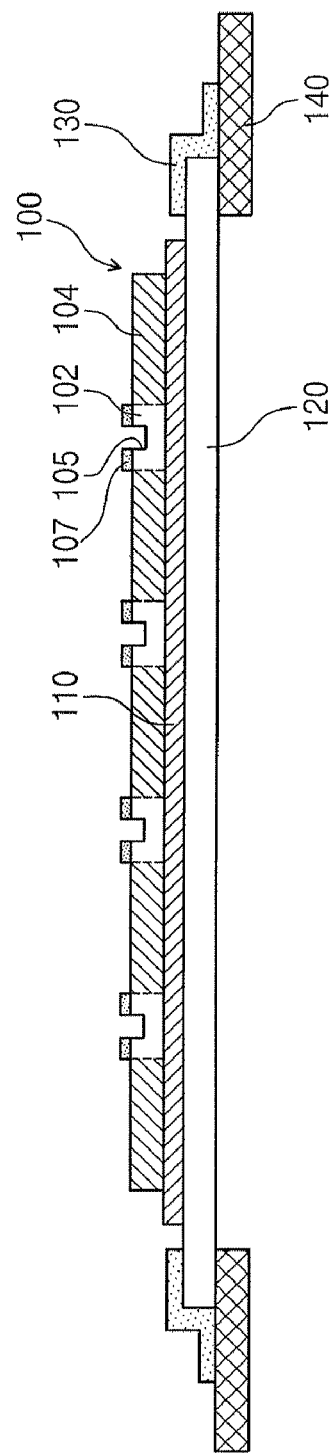

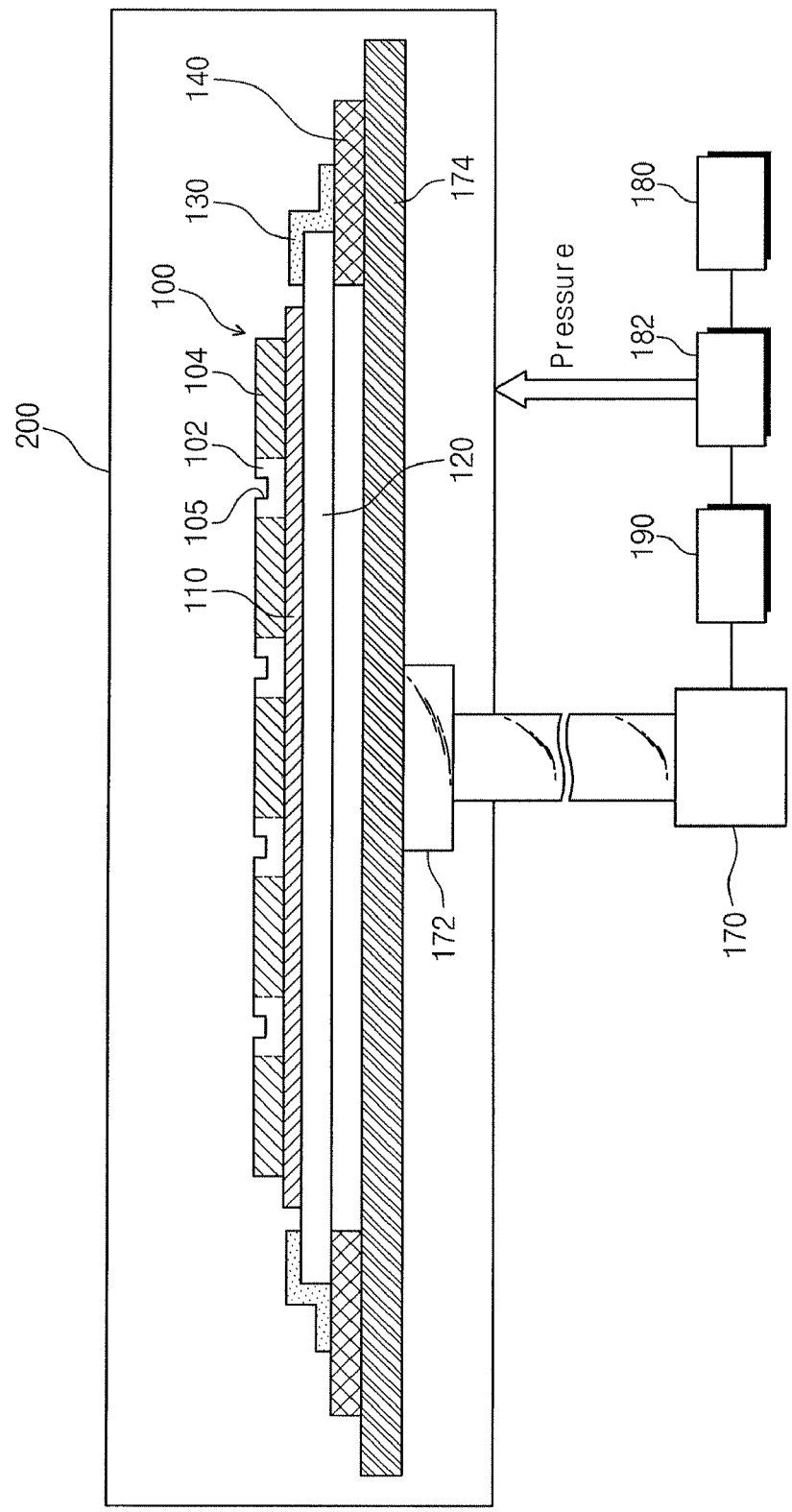

METHOD OF CUTTING SEMICONDUCTOR WAFER, SEMICONDUCTOR CHIP APPARATUS, AND CHAMBER TO CUT WAFER

CROSS-REFERENCE TO RELATED APPLICATIONS

This U.S. non-provisional patent application claims priority under 35 U.S.C. §119 of Korean Patent Application No. 10-2007-0112165, filed on Nov. 5, 2007, the entire contents of which are hereby incorporated by reference.

BACKGROUND OF THE INVENTION

1. Field of the Invention

The present general inventive concept relates to a method of manufacturing a semiconductor device, and more particularly, to a method of cutting a semiconductor wafer, an apparatus to cut a semiconductor wafer, a semiconductor chip formed by the method, and an apparatus having the semiconductor.

2. Description of the Related Art

Through a series of manufacturing processes, an integrated circuit (IC) is formed on a semiconductor wafer. The semiconductor wafer is separated into a plurality of unit chips through a chip separation process. While the chip separation process can be performed using a laser beam or using a sawing apparatus employing a diamond wheel blade.

However, when such a diamond wheel blade is used, the sawing process is lengthy, cracks may be generated in unit chips, and metal residue may cause defects.

SUMMARY OF THE INVENTION

The present general inventive concept provides an apparatus and a method of cutting a semiconductor wafer with a reduced processing time and high product quality.

Additional aspects and utilities of the present general inventive concept will be set forth in part in the description which follows and, in part, will be obvious from the description, or may be learned by practice of the general inventive concept.

The foregoing and/or other aspects and utilities of the present general inventive concept may be achieved by providing an apparatus and method of cutting a semiconductor wafer, the apparatus and method including preparing a semiconductor wafer including a scribe region and a chip region, forming a groove in the scribe region, loading the semiconductor wafer with the groove formed therein in a chamber, and cutting the semiconductor wafer into a plurality of chips through increasing a pressure of the chamber by a first pressure change rate, and then reducing the pressure of the chamber by a second pressure change rate.

The second pressure change rate may be greater than the first pressure change rate.

The semiconductor wafer may increase in volume according to the second pressure change rate, and may be cut into the plurality of chips.

The groove may be formed using a diamond cutting method.

The preparing of the semiconductor wafer may include attaching the semiconductor wafer to a dicing stage, using a die attach film.

The method may further include, prior to the forming of the groove, forming a dam on the scribe region to enclose the chip region.

The dam may be formed of an adhesive film, the adhesive film may have a thickness of about 2 μm or more, and the adhesive film may include acryl polymer.

The method may further include, after the forming of the groove, forming a dam at either side of the groove to enclose the chip region.

The groove may be formed with a depth of about 2 μm or more, and the dam may be formed of an adhesive film having a thickness of about 2 μm or more.

The chamber may include vacuum equipment in which the semiconductor wafer is loaded, and the method for cutting a semiconductor substrate may further include, after the loading of the semiconductor wafer, applying vibrations to the semiconductor wafer.

The reducing of the pressure of the chamber may be performed simultaneously with the applying of the vibrations to the semiconductor wafer.

The foregoing and/or other aspects and utilities of the present general inventive concept may also be achieved by providing a semiconductor chip formed with the above method, the above wafer cutting chamber capable of pressure variation, and an apparatus having the above semiconductor chip.

The foregoing and/or other aspects and utilities of the present general inventive concept may also be achieved by providing a semiconductor chip including a chip region having an integrated circuit, and a scribe region extended from the chip region in a first direction and having a contact-cut portion and a non-contact cut portion extended from the contact-cut surface in a second direction.

The contact-cut portion may have a first length in the first direction, and the non-contact-cut portion may have a second length in the first direction.

The contact-cut portion may be formed using a first tool, and the non-contact-cut portion may be formed using a second tool.

The foregoing and/or other aspects and utilities of the present general inventive concept may also be achieved by providing a method of forming a chip unit from a semiconductor wafer, the method including forming a contact-cut portion on a scribe region extended from a chip region in a first direction, and forming a non-contact cut portion extended from the contact-cut surface on the scribe region in a first direction.

The foregoing and/or other aspects and utilities of the present general inventive concept may also be achieved by providing an apparatus to form a chip unit from a semiconductor wafer, the apparatus including a chamber to accommodate a semiconductor wafer having one or more chip regions each having an integrated circuit, and scribe regions extended from and formed between the chip regions in a first direction and having a contact-cut portion, and a pressure generator to increase and decrease pressure of the chamber, and a control unit to control the pressure of the chamber to form a non-contact cut portion extended from the contact-cut surface in a second direction.

The foregoing and/or other aspects and utilities of the present general inventive concept may also be achieved by providing a method of forming a chip unit from a semiconductor wafer, the method including disposing in a chamber a semiconductor wafer having one or more chip regions each having an integrated circuit, and scribe regions extended from and formed between the chip regions in a first direction and having a contact-cut portion, and controlling pressure of the chamber using a pressure generator to form a non-contact cut portion extended from the contact-cut surface in a second direction.

The foregoing and/or other aspects and utilities of the present general inventive concept may also be achieved by providing an electrical apparatus including a memory unit including a semiconductor chip having a chip region having an integrated circuit, and a scribe region extended from the chip region in a first direction and having a contact-cut portion and a non-contact cut portion extended from the contact-cut surface in a second direction, and a processing unit to process data to be stored in the memory unit and to read data from the memory unit.

The electrical apparatus may further include an output unit to generate at least one of an image and sound to correspond to the data.

The processing unit may communicate with an external device to receive the data and to output the data.

The foregoing and/or other aspects and utilities of the present general inventive concept may also be achieved by providing a semiconductor chip, including a chip region having an integrated circuit, and a scribe region extended from the chip region in a first direction and having a cut portion disposed in a second direction with a first surface roughness and a second surface roughness.

BRIEF DESCRIPTION OF THE DRAWINGS

These and/or other aspects and utilities of the present general inventive concept will become apparent and more readily appreciated from the following description of the embodiments, taken in conjunction with the accompanying drawings of which:

FIGS. 3 through 8 are diagrams illustrating methods of cutting a semiconductor wafer according to embodiments of the present general inventive concept;

DETAILED DESCRIPTION OF THE PREFERRED EMBODIMENTS

Figure 1:
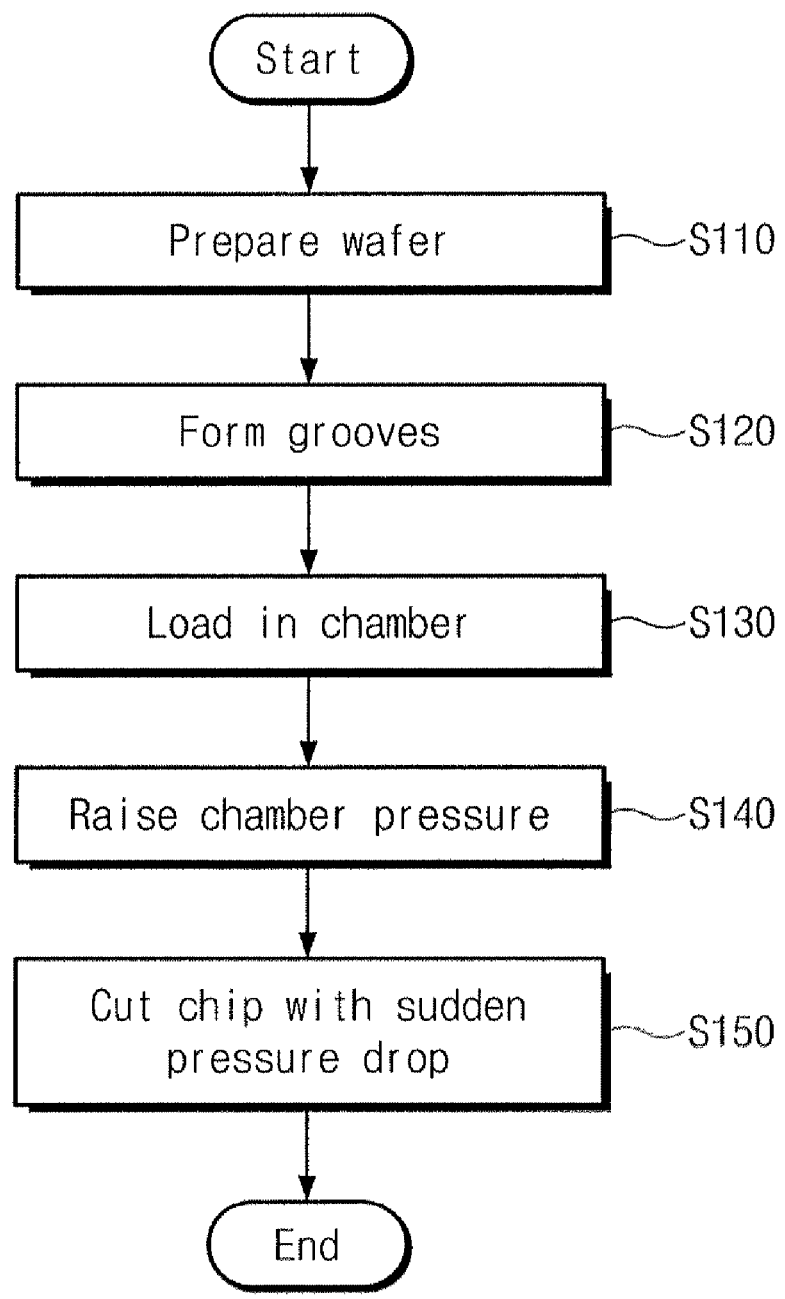
FIGS. 1 and 2 are flowcharts illustrating methods of cutting a semiconductor wafer according to embodiments of the present general inventive concept.

Reference will now be made in detail to the embodiments of the present general inventive concept, examples of which are illustrated in the accompanying drawings, wherein like reference numerals refer to the like elements throughout. The embodiments are described below in order to explain the present general inventive concept by referring to the figures.

In the figures, the dimensions of layers and regions are exaggerated for clarity of illustration. It will also be understood that when a layer (or film) is referred to as being 'on' another layer or substrate, it can be directly on the other layer or substrate, or intervening layers may also be present. Like reference numerals refer to like elements throughout.

In various embodiments of the present invention, while terms such as 'first', 'second', 'third', etc. are used to describe various portions, materials, etc., these terms should not be interpreted as limiting said portions, materials, etc. in any way. Such terms are used solely to discern a certain portion from another portion. It should therefore be understood that a portion described in one embodiment as a 'first portion' may be described in another embodiment as a 'second portion'.

Figure 2:
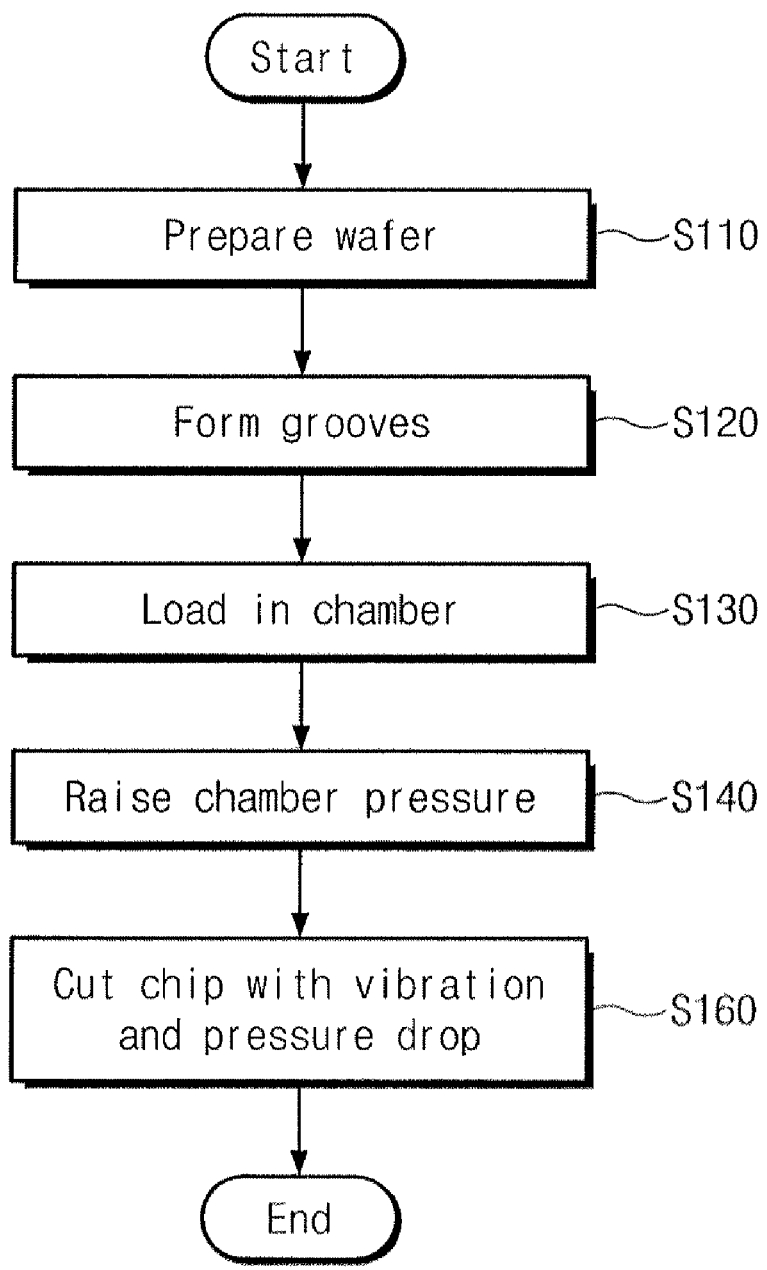

FIGS. 1 and 2 are flowcharts illustrating methods of cutting a semiconductor wafer according to embodiments of the present general inventive concept.

Referring to FIG. 1, a semiconductor wafer with an integrated circuit formed thereon is prepared in operation S110. The semiconductor wafer includes a scribe region and a chip region. The chip region is a portion in which the integrated circuit is formed, and the scribe region is a portion that is cut to separate the wafer into unit chips. The scribe region has grooves formed therein to cut portions of the semiconductor wafer in operation S120. The grooves may be formed using a diamond cutting method, and may have a depth of about 2 μm or more.

The grooves may be referred to as contact-cut portions. The grooves can be formed using a blade to cut out a portion of the scribe region as the grooves. It is possible that the grooves can be formed using a tool or an etching tool to forcibly form or press a surface of the scribe region to have a shape to correspond to the grooves.

The semiconductor wafer having cut portions is loaded into a chamber in operation S130. The pressure in the chamber is increased by a first pressure change rate in operation S140. Here, the pressure change rate refers to change in pressure over time, and the volume of the semiconductor wafer is reduced as pressure increases. In operation S150, the pressure in the chamber is decreased from the first pressure change rate to a greater second pressure change rate to cut the semiconductor wafer into a plurality of chips. Because the second pressure change rate is greater than the first pressure change rate, the volume of the semiconductor wafer suddenly increases, so that the separation occurs along the grooves.

Referring to FIG. 2, instead of separating the chips in operation S150, a negative pressure is applied in operation S160 to suddenly reduce the pressure and separate the chips. By dropping pressure and applying negative pressure, the chips may be more easily separated.

The separated portion of the scribe region is formed from the grooves to another surface of the scribe region. The separated portion can be referred to as non-contact cut portions. The non-contact portions are formed not using the above-described blade or tools.

FIGS. 3 through 8 are diagrams illustrating methods of cutting a semiconductor wafer according to embodiments of the present general inventive concept. FIGS. 4, 5A, 6A, and 7A are sectional views taken along line I-I' in FIG. 3. FIGS. 5B, 6B, and 7B are plan views of semiconductor wafers according to embodiments of the present general inventive concept. FIG. 8 is a diagram illustrating a semiconductor wafer loaded in a chamber according to an embodiment of the present general inventive concept.

Figure 3:
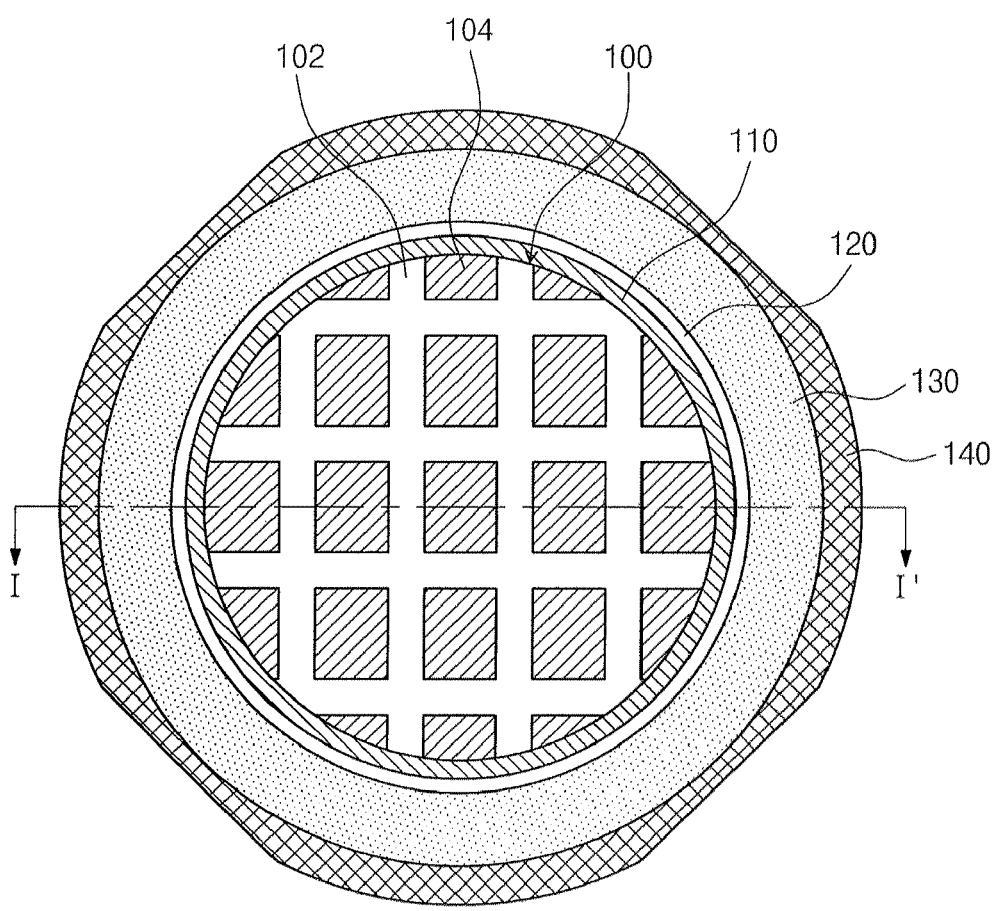
Figure 4:
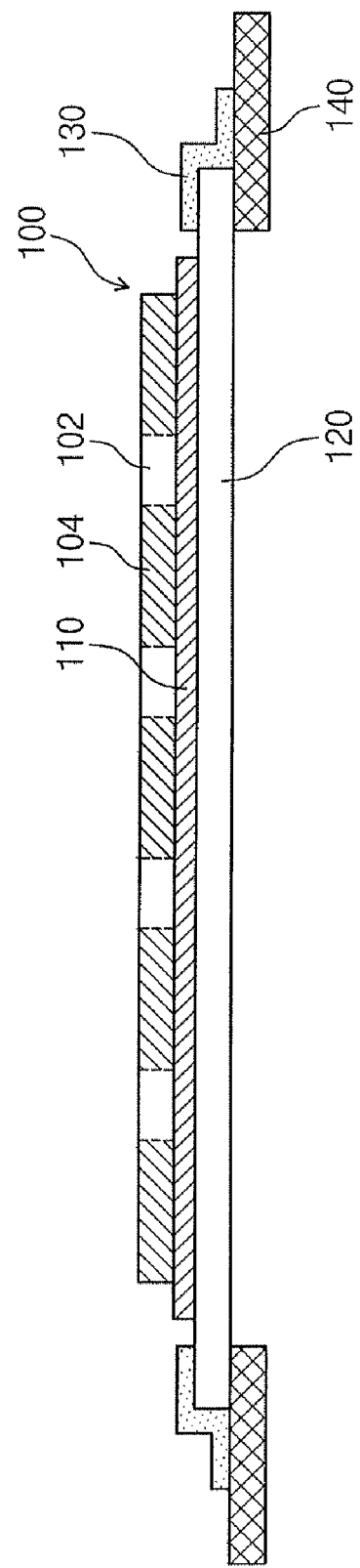

Referring to FIGS. 3 and 4, a semiconductor wafer 100 including a scribe region 102 and a chip region 104 is prepared. The semiconductor wafer 100 uses a die attach film (DAF) 110 to adhere to a dicing stage 120. The DAF 110 may be acryl polymer-based, and the dicing stage 120 may be polyolefine-based. Thus, the DAF 110 and the dicing stage 120 may be attached to one another due to their viscosity.

The dicing stage 120 is attached to a wafer ring 140 with a wafer ring attaching member 130 in between. The wafer ring 140 may be a metal material. The wafer ring attaching member 130 may be an annular tape having an adhesive material applied thereon.

Figure 5A:
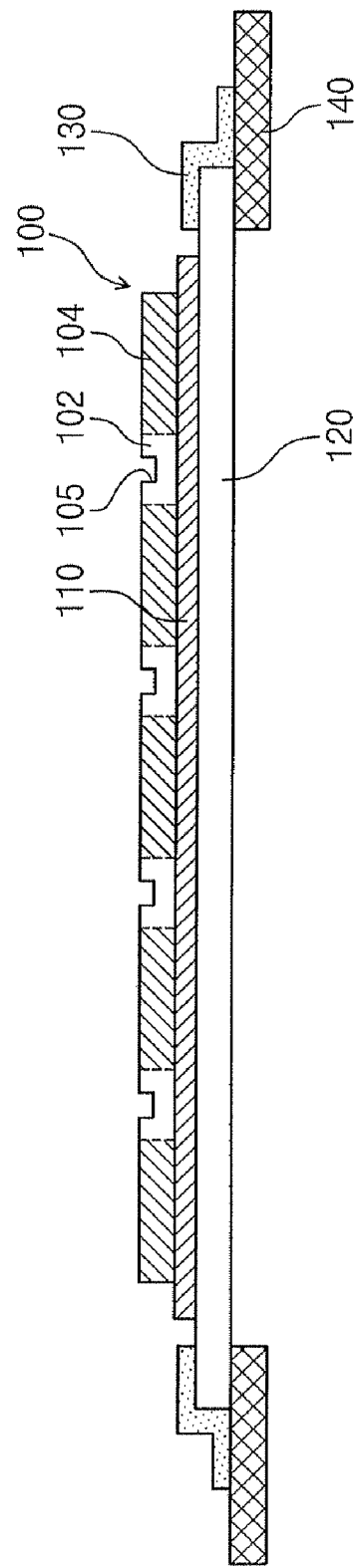
Figure 5B:
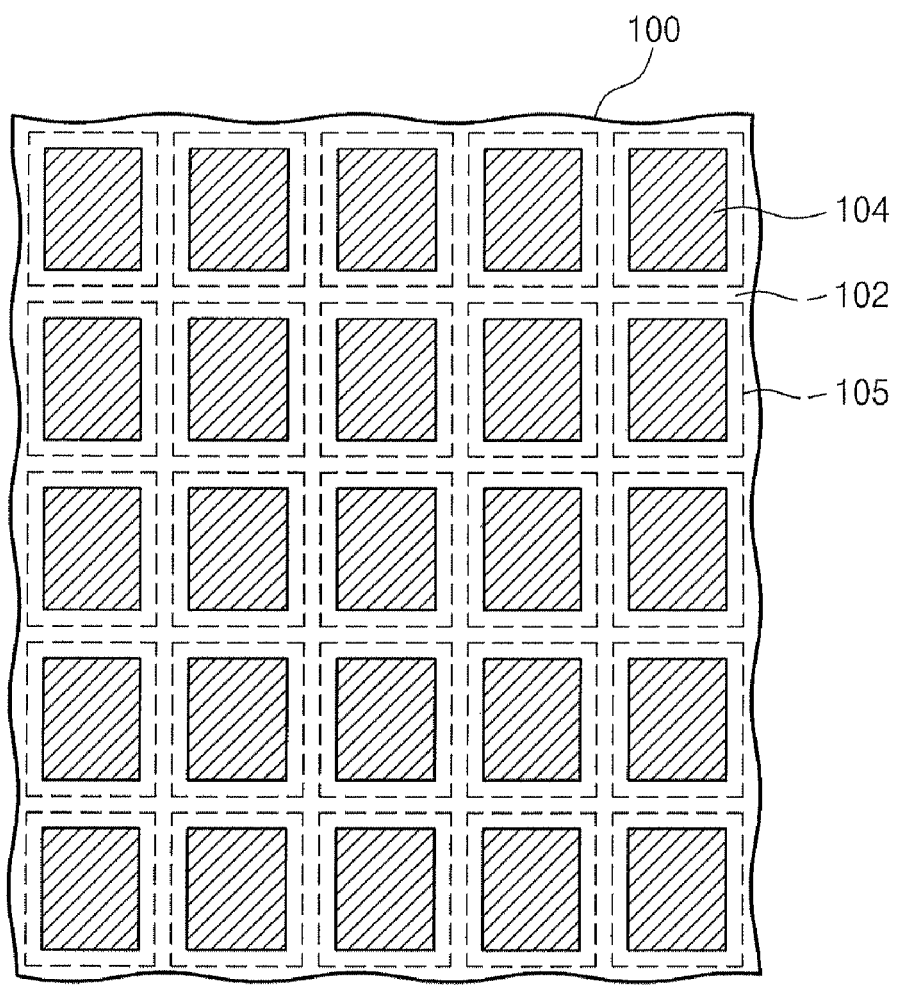

Referring to FIGS. 5A and 5B, grooves 105 are formed in the scribe regions 102. The grooves 105 may be formed using a diamond cutting method. The widths of the grooves 105 may be less than the width of the scribe regions 102. The grooves 105 enclose the chip regions 104 on the scribe regions 102 as illustrated in FIG. 5B.

Figure 6B:
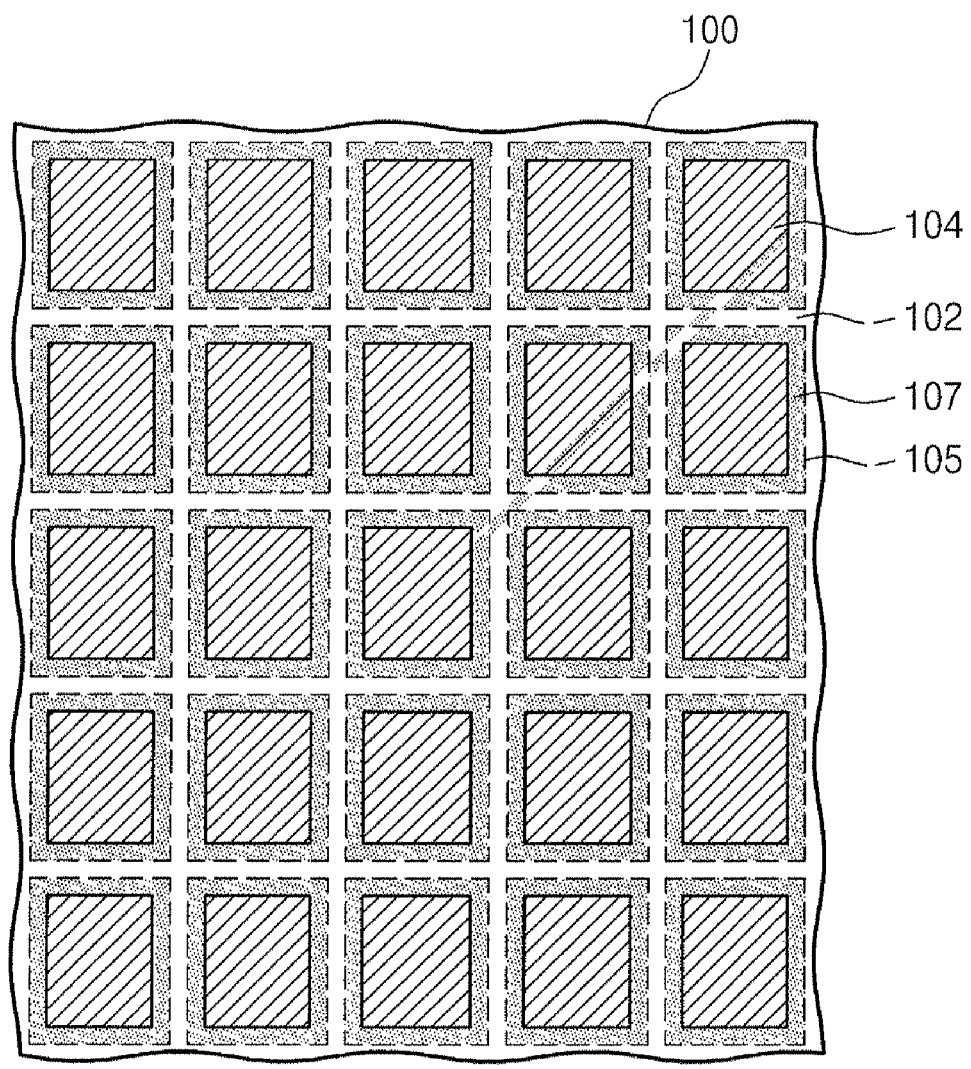

Referring to FIGS. 6A and 6B, dams 107 are formed in the scribe regions 102 on the semiconductor wafer 100. The dams 107 may be formed to enclose the chip regions 104 before the grooves 105 are formed. Accordingly, the dams 107 may remain at either side of the grooves 105 after the grooves 105 are formed. The dams 107 may be formed of an adhesive film such as acryl polymer. The adhesive film may be formed to have a thickness of about 2 μm or greater. The dams 107 may prevent formation of cracks or breaking away of the chips during the formation of the grooves 105. Alternatively, the dams 107 may be formed to enclose the chip regions 104 after the forming of the grooves 105, to be disposed at either side of the grooves 105.

Figure 7A:
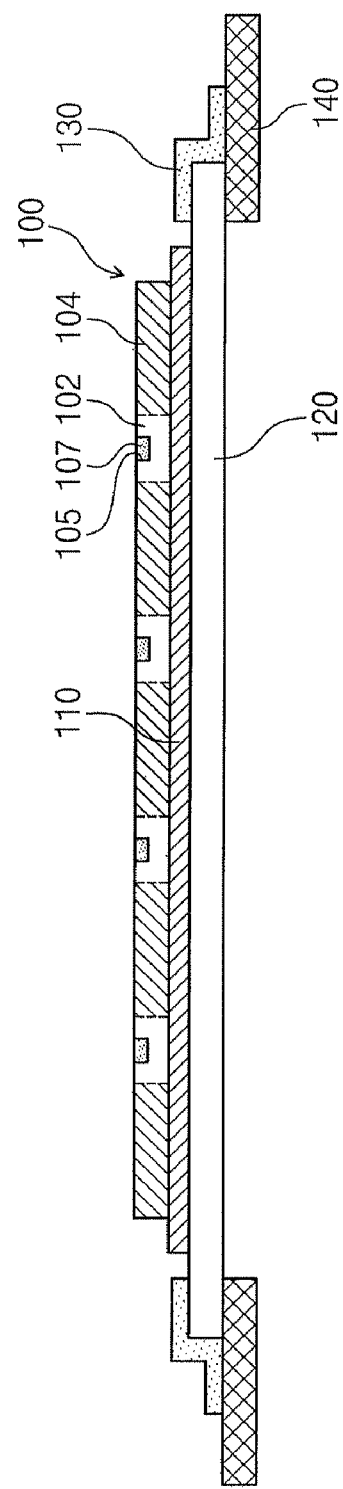
Figure 7B:
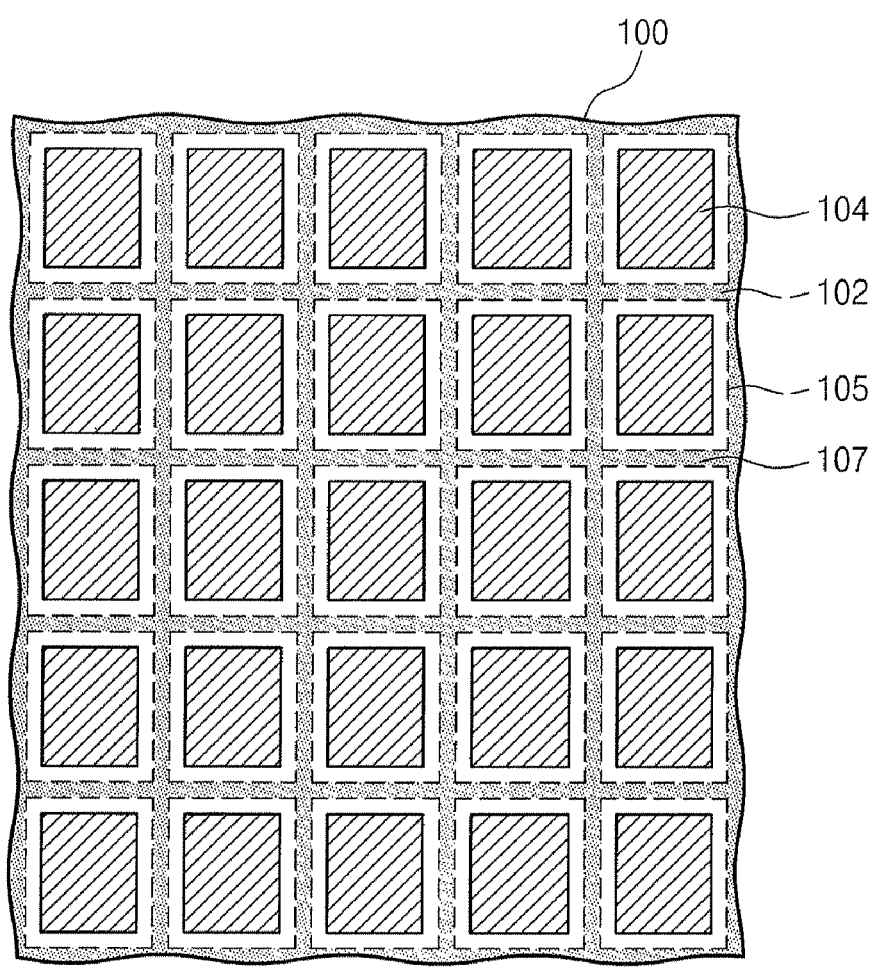

Referring to FIGS. 7A and 7B, after grooves 105 are formed, dams 107 may be formed to fill the grooves 105. The dams 107, as illustrated in FIG. 7b, may be formed to enclose the chip regions 104 along the scribe regions 102. The dams 107 may be formed of an adhesive film—for example, an acryl polymer. The dams 107 can prevent the formation of cracks or breaking away of the chips during the separating of the semiconductor wafer 100 into a plurality of chips.

Referring to FIG. 8, the chamber 200 includes a wafer loading table 174 to load the semiconductor wafer 100, a vibration transmitter 172 to transmit vibrations to the loading table 174, and a vibrating device 170 to generate vibrations for the vibration transmitter 172. Additionally, the chamber 200 may have a compressor 180 to generate pressure for the chamber 200, and a pressure regulator 182 to relay the pressure generated by the compressor 180 to the chamber 200 and to regulate the pressure. A controller 190 may be provided to control the vibrations generated by the vibrating device 170 and control the pressure regulator 182 to regulate pressure.

After the grooves 105 are formed, the semiconductor wafer 100 is loaded in the chamber 200. The pressure in the chamber 200 is increased with the first pressure change rate, after which the pressure is reduced with the second pressure change rate greater than the first pressure change rate, in order to cut the semiconductor wafer 100 into a plurality of chips. The change in pressure may be regulated by the pressure regulator 182. The plurality of chips is adhered to the DAF 110 so that the chips retain their original positions, and ultraviolet rays may be emitted onto the DAF 110 to negate the adhesiveness of the DAF 110. Accordingly, the plurality of chips may be separated from the die stage 120. After being loaded in the chamber 200, the semiconductor wafer 100 may be subjected to vibrations from the vibration table 174, and the pressure within the chamber 200 may be reduced. By applying the vibrations, separation of the semiconductor wafer 100 can be more easily achieved.

Figure 9A:
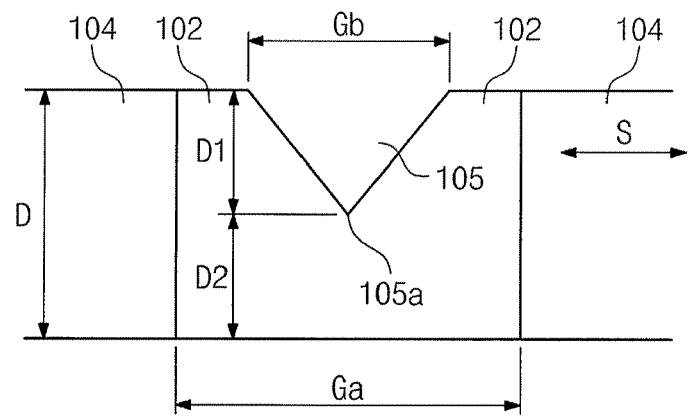
FIGS. 9A and 9B are views illustrating a groove formed on a semiconductor wafer according to an embodiment of the present general inventive concept.
Figure 9B:
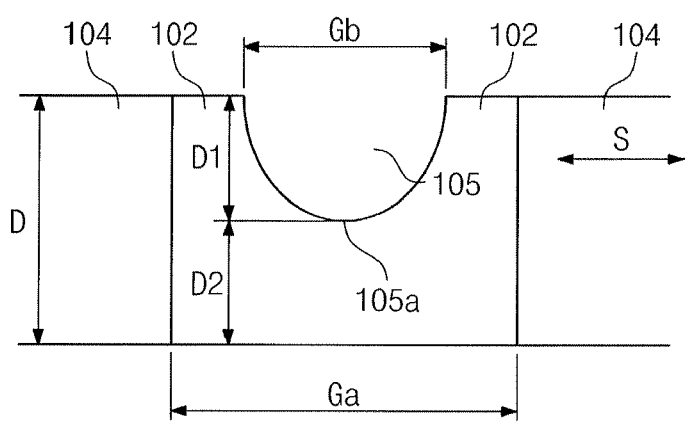

FIGS. 9A and 9B are views illustrating a groove formed on a semiconductor wafer according to an embodiment of the present general inventive concept. The semiconductor wafer may have a thickness D to correspond to a thickness D1 of a groove 105 of the scribe region 102 and a thickness D2 of a non-groove portion of the scribe portion 102. The groove 105 may have one or more surfaces having a triangular or curved shape. However, the present general inventive concept is not limited thereto. The one or more surfaces may be a surface a semi-circle or other shape. The groove 105 may have a width Gb smaller than a width Ga of the scribe region 102 in a direction of a major surface S of the semiconductor wafer or a unit chip 104. However, the present general inventive concept is not limited thereto. The width Gb of the groove 105 may be the substantially same as the width Ga of the scribe region 105. It is possible that a point 105a of the groove 105 may be disposed at a lowest position of the groove 105 or may be disposed at a center line of the groove 105 such that the semiconductor wafer can be divided according to the point 105a of the groove 105.

Figure 10A:
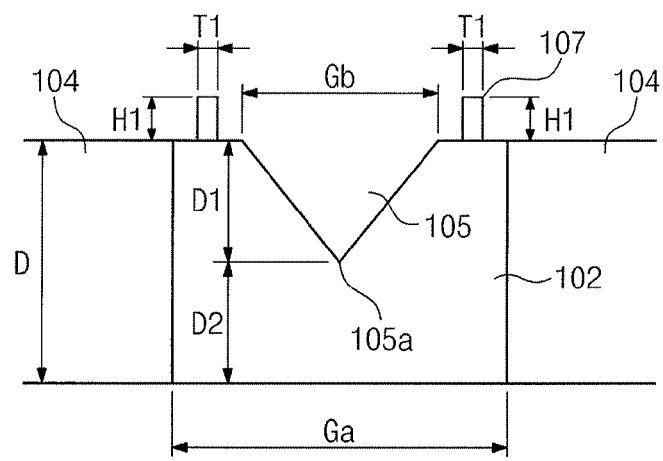
FIGS. 10A and 10B are views illustrating a dam formed on a semiconductor wafer according to an embodiment of the present general inventive concept.
Figure 10B:
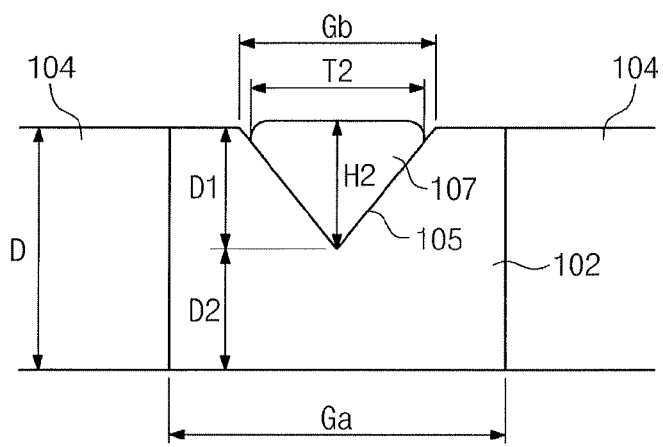

FIGS. 10A and 10B are views illustrating a dam formed on a semiconductor wafer according to an embodiment of the present general inventive concept. The semiconductor wafer of FIGS. 10A and 10B may be similar to the semiconductor wafer of FIGS. 1-9B. The dam 107 of FIG. 10A may be formed on a surface of the scribe region 102 or filled in the groove 105 of the scribe region 102. The dam 107 may have a thickness T1 and a height H1. The thickness T1 of the dam 107 may be smaller than a thickness D1 of the groove 105, and the height H1 of the dam 107 may be smaller that a width Gb of the groove 105. However, the present general inventive concept is not limited thereto. The thickness T1 and height H1 of the dam 107 can be adjusted according to a size (width, area or volume) of at least one of the groove 105, the scribe region, or a thickness D of the semiconductor chip.

The dam 107 of FIG. 10B may have a thickness T2 and a height H2. The thickness T2 of the dam 107 may be smaller than the thickness D1 of the groove 105, and the height H1 of the dam 107 may be smaller that the width Gb of the groove 105. However, the present general inventive concept is not limited thereto. A shape or the thickness T1 and height H1 of the dam 107 can be similar to that of the groove 105. The height H2 of the dam 107 may be higher than the thickness D1 of the groove 105. The thickness T1 and height H1 of the dam 107 can be adjusted according to a size (width, area or volume) of at least one of the groove 105, the scribe region, or a thickness D of the semiconductor chip.

Figure 11A:
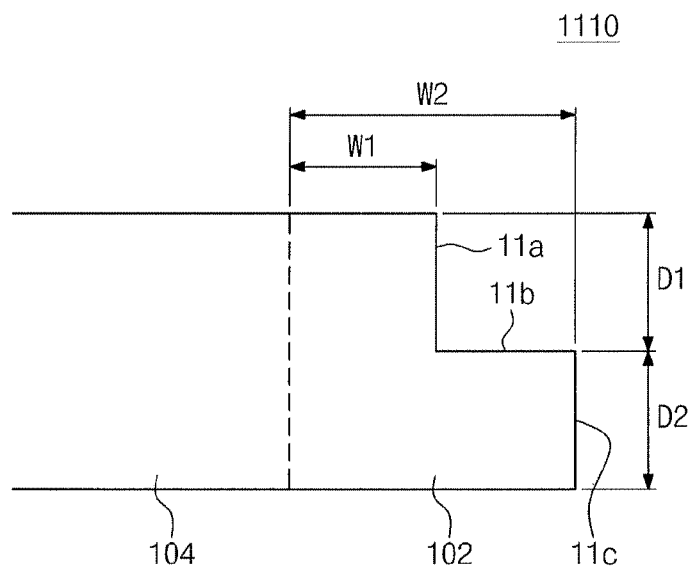
FIGS. 11A, 11B, and 11C are views respectively illustrating a unit chip and a semiconductor chip according to an embodiment of the present general inventive concept.
Figure 11B:
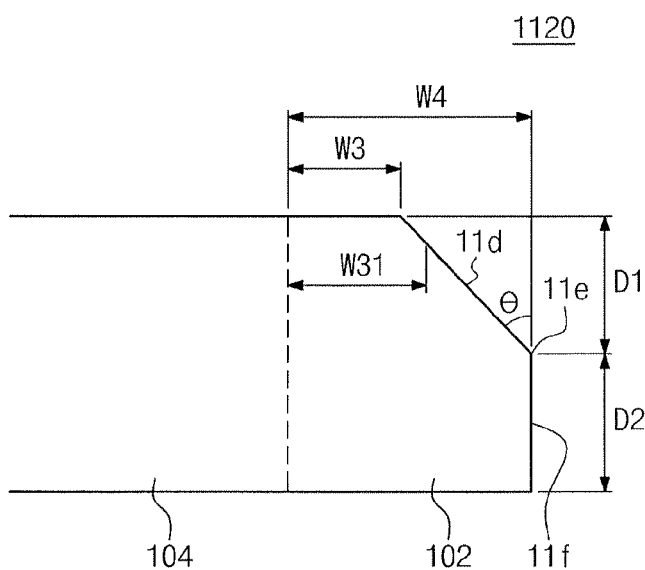

FIGS. 11A and 11B are views illustrating unit chips 1110 and 1120 according to an embodiment of the present general inventive concept. The unit chips 1110 and 1120 may correspond to the unit chip of FIGS. 1-8. The unit chip 1110 may have the chip region 104 and the scribe region 102. The scribe region 102 of the unit chip 1110 can have a first surface 11a, a second surface 11b, and a third surface 11c. At least one of the first surface 11a and the second surface 11b of the scribe region 102 of the unit chip 1110 may correspond to a surface of the groove 105 of FIGS. 1-9B.

The first surface 11a or the second surface 11b may be referred to as a contact cut portion formed by a contact between the scribe region 102 and a cutting blade (or using the above-described diamond cutting method), and the third surface may correspond to a non-contact cutting portion formed by a non-contact on the scribe region 102, for example, the above-described cutting method using the chamber pressure. The non-contact cutting portion 11c can be formed not using a blade cutting method but using a non-blade cutting method, such as a pressure or a non-blade. The second surface 11b may be a combination of a portion of the contact cut portion 11a and a portion of the non-contact cut portion 11c since the second surface 11b is disposed between the contact cut portion 11a and the non-contact cut portion 11c.

The scribe region 102 may have a portion corresponding to the first surface 11a to have a width W1 with respect to a reference, for example, a boundary between the chip region 104 and the scribe region 102, and another portion corresponding to the third surface 11c to have a width W2 with respect to the reference. The width W2 may be larger than the width W1.

The scribe region 102 of the unit chip 1120 of FIG. 11B can have a fourth surface 11d, a fifth surface 11e, and a sixth surface 11f. At least one of the fourth surface 11d and the fifth surface 11e of the scribe region 102 of the unit chip 1110 may correspond to a shape of one of the grooves 105 of FIGS. 1-9B.

The fourth surface 11d or the fifth surface 11e may be referred to as a contact cut portion formed by a contact between the scribe region 102 and a cutting blade (or using the above-described diamond cutting method), and the sixth surface 11f may correspond to a non-contact cutting portion formed by a non-contact on the scribe region 102, for example, the above-described cutting method using the chamber pressure. The non-contact cutting portion 11f can be formed not using a blade cutting method but using a non-blade cutting method, such as a pressure or a non-blade. The fifth surface 11e may be a combination of a portion of the contact cut portion 11d and a portion of the non-contact cut portion 11f since the fifth surface 11e is disposed between the contact cut portion 11d and the non-contact cut portion 11f. The fifth surface 11e may be a point or an area disposed between the fourth surface 11d and the sixth surface 11f. The fourth surface 11d and the sixth surface 11f may form an angle with respect to a direction perpendicular to the major surface direction S of the chip region 104.

The scribe region 102 may have a portion corresponding to the fourth surface 11d to have a variable width W3 with respect to a reference, for example, a boundary between the chip region 104 and the scribe region 102, and another portion corresponding to the sixth surface 11f to have a width W4 with respect to the reference. The width W4 may be larger than the width W3. When the variable width W3 can be variable to, for example, W31, the width W4 may be a largest one of the variable width W3.

Since the contact-cut method and the non-contact-cut method are applied to the scribe region 104 of the semiconductor wafer to form the chip units, the first through sixth surfaces 11a, 11b, 11c, 11d, 11e, and 11f may have first through sixth surface roughness. For example, the first surface roughness of the first surface 11a may be different from the third roughness of the third surface 11c, and the fourth surface roughness of the fourth surface 11d may be different from the sixth surface roughness of the sixth surface 11f.

Figure 11C:
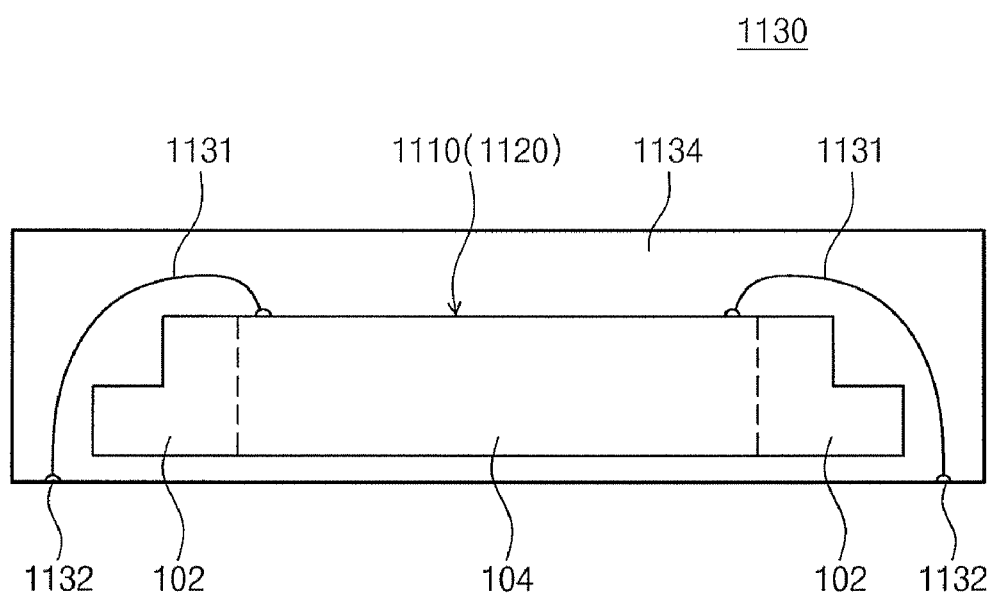

FIG. 11C illustrates a semiconductor chip 1130 according to an embodiment of the present general inventive concept. The semiconductor chip 1130 is formed with the unit chip (1110, 1120, etc) having a chip region 104 and a scribe region 104 as illustrated in FIGS. 1-11B, one or more bonding wires 1131 connected to corresponding pads of one or more integrated circuits (one or more memory cells) formed in the chip region 104, one or more terminals (bonding pads) connected to the corresponding bonding wires, and a molding 1134 formed to seal the unit chip according to a molding process. Since the molding process is well known, detailed descriptions of the molding process will be omitted. The semiconductor chip 130 may include two or more unit chips electrically connected to each other. The terminals 1132 of the semiconductor chip 1130 can be connected to an external device to receive data from the external device and to store the data in the memory cells of the chip region 104 of the chip unit.

When the dam 107 is formed on a surface of the scribe region 102 or filled in the groove 105, the dam 107 may be removed from the surface of the scribe region 102 or filled in the groove 105. However, it is possible that at least a portion of the dam 107 can remain on at least one of the surfaces 11a, 11b, 11d, and 11e.

Figure 12:
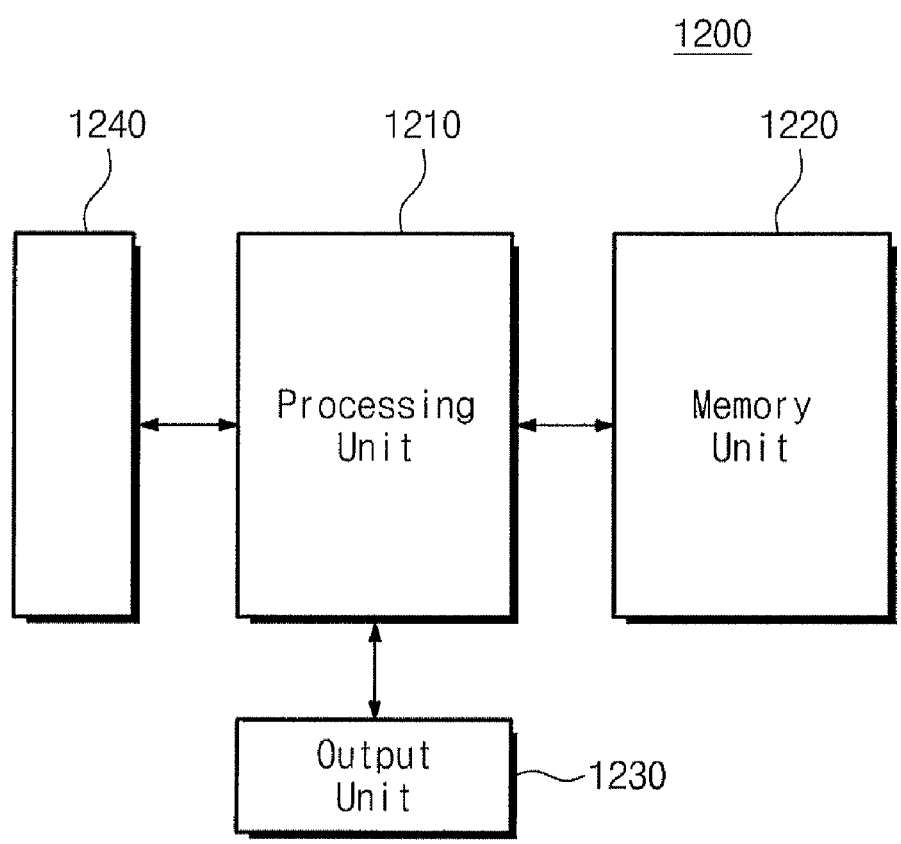
FIG. 12 is an apparatus using the semiconductor chip according to an embodiment of the present general inventive concept.

FIG. 12 is a view illustrating an apparatus 1200 with a semiconductor chip according to an embodiment of the present general inventive concept. The apparatus 1200 may include a processing unit 1210, a memory unit 1220, and an output unit 1230. The semiconductor chip corresponding to one or more unit chips and semiconductor chips illustrated in FIGS. 11A, 11B, and 11C or one or more chip units formed according to the apparatus and method of FIGS. 1-9B can be used as the memory unit 1220. A semiconductor chip package having one or more semiconductor chips can be used as the memory unit 1220. The processing unit controls the memory unit 1220 to store data or to read out the data in or from the memory unit 1220. The processing unit 1210 may communicate with an external device to receive a signal to correspond to the data and may process the signal or data. Communication between the processing unit 1210 and the external device 1240 can be performed through a wired or wires communication. At least one additional element can be added between the processing unit 1210 and the external device 1240 to perform the communication according to at least one of the wired and wireless communication. The output unit 1230 is a unit to generate an image, sound, or signal according to a control signal of the processing unit 1210 to correspond to the signal and/or data. The apparatus 120 may be a computer, an image processing device, a sound generating device, an image scanning device, a wireless device, etc.

The semiconductor chip corresponding to the semiconductor chip of FIG. 11C or a chip unit formed according to the apparatus and method of FIGS. 1-11B has the chip region 104 having an integrated circuit and terminals formed end portions of the integrated circuit as described above. The terminals of the chip region 104 of the semiconductor chip can be electrically connected to corresponding terminals of the processing unit 1210.

According to embodiments of the present general inventive concept, the time required to cut a wafer can be shortened, and high quality chips can be manufactured.

According to embodiments of the present general inventive concept, a semiconductor wafer is cut by forming grooves thereon and loading it in a pressure chamber. Accordingly, the time taken to cut the semiconductor wafer is reduced, and high quality chips can be manufactured.

Although a few embodiments of the present general inventive concept have been shown and described, it will be appreciated by those skilled in the art that changes may be made in these embodiments without departing from the principles and spirit of the general inventive concept, the scope of which is defined in the appended claims and their equivalents.

What is claimed is:

1. A method for cutting a semiconductor wafer, comprising:
   preparing a semiconductor wafer comprising a scribe region and a chip region;
   forming a groove in the scribe region;
   loading the semiconductor wafer with the groove formed therein in a chamber; and
   cutting the semiconductor wafer into a plurality of chips through increasing a pressure of the chamber by a first pressure change rate, and then reducing the pressure of the chamber by a second pressure change rate.

2. The method of claim 1, wherein the second pressure change rate is greater than the first pressure change rate.

3. The method of claim 1, wherein the semiconductor wafer increases in volume according to the second pressure change rate, and is cut into the plurality of chips.

4. The method according to claim 1, wherein the groove is formed using a diamond cutting method.

5. The method according to claim 1, wherein the preparing of the semiconductor wafer comprises attaching the semiconductor wafer to a dicing stage, using a die attach film.

6. The method of claim 1, further comprising, prior to the forming of the groove, forming a dam on the scribe region to surround the chip region.

7. The method of claim 6, wherein the dam is formed of an adhesive film.

8. The method of claim 7, wherein the adhesive film has a thickness of about 2 μm or more.

9. The method of claim 7, wherein the adhesive film comprises acryl polymer.

10. The method of claim 1, further comprising, after the forming of the groove, forming a dam at either side of the groove to enclose the chip region.

11. The method of claim 1, further comprising, after the forming of the groove, forming a dam to fill the groove to enclose the chip region.

12. The method of claim 11, wherein the groove is formed with a depth of about 2 μm or more.

13. The method of claim 12, wherein the dam is formed of an adhesive film having a thickness of about 2 μm or more.

14. The method of claim 1, wherein the chamber comprises vacuum equipment in which the semiconductor wafer is loaded, the method further comprising, after the loading of the semiconductor wafer, applying vibrations to the semiconductor wafer.

15. The method of claim 14, wherein the reducing of the pressure of the chamber is performed simultaneously with the applying of the vibrations to the semiconductor wafer.

* * * * *